United States Patent
Kim et al.

(10) Patent No.: US 10,256,181 B2
(45) Date of Patent: Apr. 9, 2019

(54) PACKAGE SUBSTRATES

(71) Applicant: Samsung Electronics Co., Ltd., Suwon-si, Gyeonggi-do (KR)

(72) Inventors: JinGyu Kim, Asan-si (KR); Taehun Kim, Asan-si (KR); JiSun Hong, Asan-si (KR); Byungmoon Bae, Daegu (KR); Se-Ho You, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/029,030

(22) Filed: Jul. 6, 2018

(65) Prior Publication Data

US 2018/0315698 A1 Nov. 1, 2018

Related U.S. Application Data

(63) Continuation of application No. 15/236,868, filed on Aug. 15, 2016, now Pat. No. 10,032,706.

(30) Foreign Application Priority Data

Sep. 11, 2015 (KR) ........................ 10-2015-0128908

(51) Int. Cl.
*H01L 23/498* (2006.01)
*H01L 23/00* (2006.01)
*H01L 23/60* (2006.01)
*H01L 23/29* (2006.01)

(52) U.S. Cl.
CPC ...... *H01L 23/49838* (2013.01); *H01L 23/562* (2013.01); *H01L 23/60* (2013.01); *H01L 23/293* (2013.01); *H01L 23/49816* (2013.01); *H01L 24/13* (2013.01); *H01L 24/16* (2013.01); *H01L 2224/1312* (2013.01); *H01L 2224/13109* (2013.01); *H01L 2224/13111* (2013.01); *H01L 2224/13113* (2013.01); *H01L 2224/13139* (2013.01); *H01L 2224/13147* (2013.01); *H01L 2224/13155* (2013.01); *H01L 2224/16237* (2013.01); *H01L 2924/1431* (2013.01); *H01L 2924/1434* (2013.01); *H01L 2924/15311* (2013.01); *H01L 2924/3511* (2013.01)

(58) Field of Classification Search
CPC ......... H01L 23/49838; H01L 23/49816; H01L 23/562; H01L 23/60
See application file for complete search history.

(56) References Cited

U.S. PATENT DOCUMENTS

| | | | |
|---|---|---|---|
| 6,107,685 | A | 8/2000 | Nishiyama |
| 6,214,645 | B1 | 4/2001 | Kim |
| 6,246,015 | B1 | 6/2001 | Kim |

(Continued)

FOREIGN PATENT DOCUMENTS

| | | |
|---|---|---|
| JP | 2004-214430 A | 7/2004 |
| JP | 5247668 B2 | 7/2013 |

(Continued)

*Primary Examiner* — Douglas M Menz
(74) *Attorney, Agent, or Firm* — Harness, Dickey & Pierce, P.L.C

(57) ABSTRACT

A package substrate includes a substrate including a circuit region, a dummy region surrounding the circuit region, and a lower circuit pattern at the dummy region, the circuit region including unit regions arranged in a matrix shape, and solders on the lower circuit pattern, at least one of the solders electrically connected to the lower circuit pattern.

20 Claims, 9 Drawing Sheets

(56) References Cited

U.S. PATENT DOCUMENTS

| | | |
|---|---|---|
| 6,617,680 B2 | 9/2003 | Chien-Chih et al. |
| 7,091,583 B2 | 8/2006 | Chen et al. |
| 7,274,048 B2 | 9/2007 | Wu |
| 8,482,890 B2 | 7/2013 | Kim et al. |
| 2003/0038351 A1 | 2/2003 | Chien-Chih et al. |
| 2003/0218243 A1 | 11/2003 | Chen |
| 2004/0072389 A1 | 4/2004 | Chen et al. |
| 2005/0051881 A1 | 3/2005 | Chen et al. |
| 2005/0093071 A1 | 5/2005 | Wu |
| 2010/0072582 A1 | 3/2010 | Chandra et al. |
| 2011/0176246 A1 | 7/2011 | Kim et al. |
| 2014/0092572 A1 | 4/2014 | Hossain et al. |
| 2014/0159222 A1 | 6/2014 | Hong et al. |
| 2015/0027757 A1 | 1/2015 | Shin et al. |

FOREIGN PATENT DOCUMENTS

| | | |
|---|---|---|
| KR | 10-2001-0019659 A | 3/2001 |
| KR | 10-0348136 B1 | 7/2002 |
| KR | 10-0388289 B1 | 6/2003 |
| KR | 10-0400673 B1 | 10/2003 |
| KR | 10-2004-0096171 A | 11/2004 |
| KR | 10-0559512 B1 | 3/2006 |
| KR | 10-1048717 B1 | 7/2011 |

PACKAGE SUBSTRATES

CROSS-REFERENCE TO RELATED APPLICATION

This application is a continuation application of and claims priority under 35 U.S.C. § 120/121 to U.S. application Ser. No. 15/236,868 filed Aug. 15, 2016, which claims priority under 35 U.S.C. § 119 to Korean Patent Application No. 10-2015-0128908, filed on Sep. 11, 2015, in the Korean Intellectual Property Office, the entire contents of each of which are hereby incorporated by reference.

BACKGROUND

The present disclosure relates to package substrates, and in particular, to package substrates including a dummy region, on which solders are attached.

With increased demand for optimized high-density high-performance semiconductor chips, there is an increasing need for a package technology capable of improving electrical performance and heat-dissipation characteristics and increasing the number of input/output terminals. Accordingly, a ball grid array (BGA) semiconductor package is one of the package structures proposed for such a purpose. However, the BGA semiconductor package suffers from an electrostatic discharge issue (i.e., an abrupt discharge of static charges that accumulate in a semiconductor package process, for example, in a molding process).

SUMMARY

Some example embodiments of the inventive concepts provide a package substrate capable of preventing an electrostatic discharge failure from occurring in a semiconductor package process.

According to some example embodiments of the inventive concepts, a package substrate includes a substrate including a circuit region, a dummy region surrounding the circuit region, and a lower circuit pattern at the dummy region, the circuit region including unit regions arranged in a matrix shape, and solders on the lower circuit pattern, at least one of the solders electrically connected to the lower circuit pattern.

In some example embodiments, the substrate may further include a core portion including interconnection layers and insulating layers alternatingly stacked with each other, and an upper circuit pattern provided on a top surface of the core portion, and the lower circuit pattern provided on a bottom surface of the core portion.

In some example embodiments, the package substrate may further include a solder resist selectively covering the top and bottom surfaces of the core portion to expose at least a portion of the lower circuit pattern.

In some example embodiments, the solders may protrude from a bottom surface of the substrate by a height of about 1 μm to about 5 μm.

In some example embodiments, the solders may be along an edge of the substrate to form a ring-shaped arrangement.

In some example embodiments, the solders may include a set of first solders along the edge of the substrate, and a set pf second solders around and outside the set of first solders. The set of first solders may be different from the set of second solders, in terms of their sizes.

In some example embodiments, the solders may include a set of first solders, on two opposite regions relative to the circuit region in a first direction.

In some example embodiments, the solders may further include a set of second solders on two opposite regions relative to the circuit region in a second direction perpendicular to the first direction.

In some example embodiments, the set of first solders and the set of second solders may be along an edge of the substrate to form a ring-shaped arrangement, and at least one of the set of first solders and the set of second solders are disposed in a plurality of columns.

In some example embodiments, the solders may include a set of first solders along an edge of the substrate, and a set of second solders around and outside the set of first solders with respect to the circuit region. The set of first solders and the set of second solders may be disposed to have a zigzag arrangement to each other.

According to some example embodiments of the inventive concepts, a package substrate includes a substrate including a circuit region, a dummy region at least partially surrounding the circuit region, and circuit patterns, and solders on a bottom surface of the substrate, the solders connected to the circuit patterns In some example embodiments, at least one of the solders may be configured to electrically connect at least one of the circuit patterns to ground.

In some example embodiments, the solders may be arranged to be symmetric about the circuit region.

In some example embodiments, the solders may include a set of first solders adjacent to the circuit region, and a set of second solders adjacent to an edge of the substrate. The set of first solders may be different from the set of second solders, in terms of their sizes.

In some example embodiments, the set of first solders and the set of second solders may have a first height and a second height, respectively, when measured in a direction normal to the bottom surface of the substrate, and a height difference between the first height and the second height may be within a range from about 1 μm to about 5 μm.

According to an example embodiment of the inventive concepts, a package substrate includes a substrate including a circuit region, a dummy region surrounding the circuit region, and a lower circuit pattern at the dummy region on a bottom surface of the substrate, and solders on the lower circuit pattern, the solders at least partially surrounding the circuit region, at least some of the solders configured to be grounded when connected to a ground terminal of a mold structure in performing a mold process.

In some example embodiments, the solders may be at two opposite sides, from among four sides, of the substrate.

In some example embodiments, at least some of the solders may protrude from the bottom surface of the substrate by a height of about 1 μm to about 5 μm.

In some example embodiments, the solders include a set of first solders in the dummy region, and a set of second solders around and outside the set of first solders with respect to the circuit region. The set of first solders may be different from the set of second solders, in terms of their heights with respect to the bottom surface of the substrate.

In some example embodiments, a height of the set of first solders may be greater than a height of the set of second solders.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
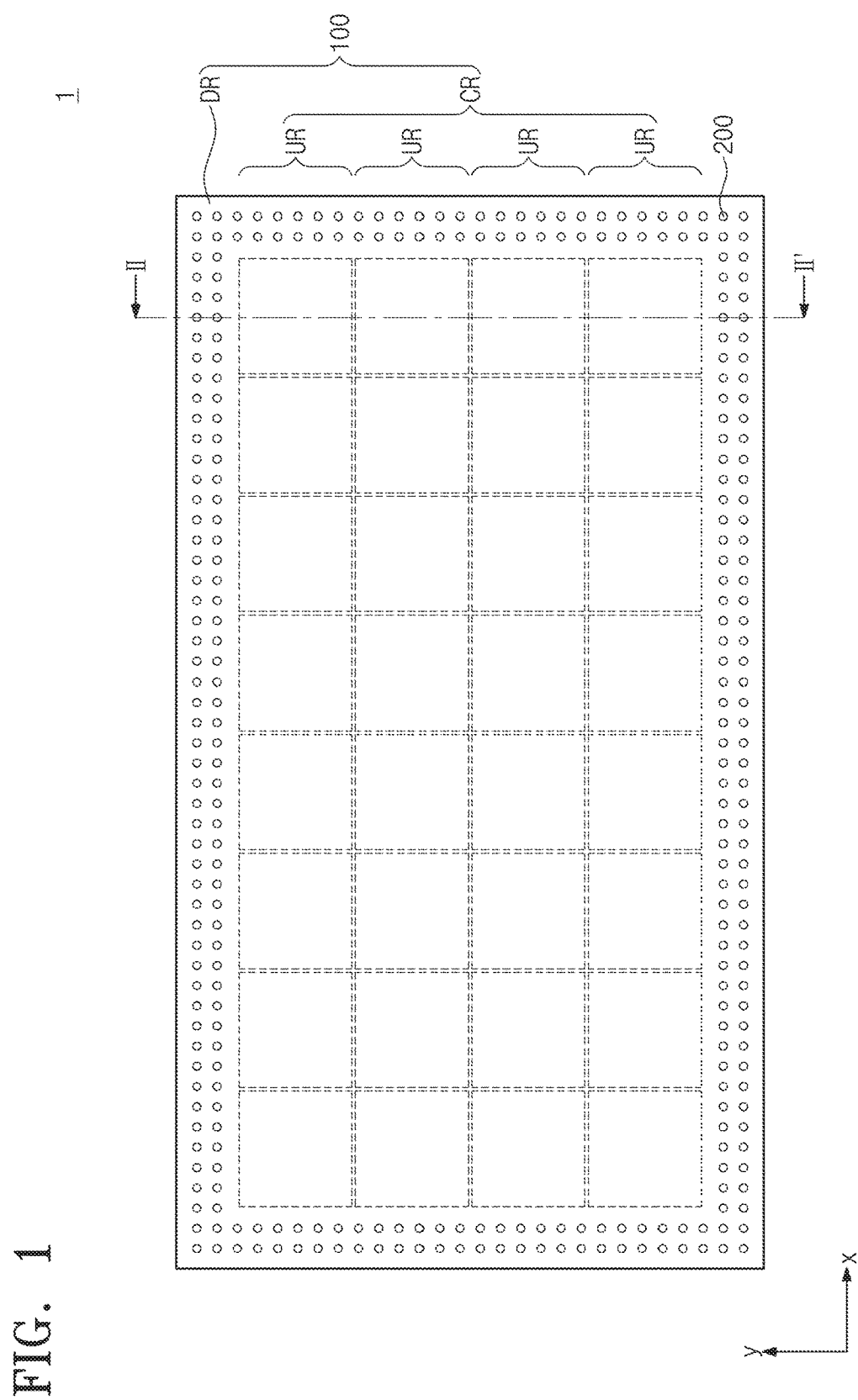
FIG. 1 is a plan view illustrating a package substrate according to some example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments of the inventive concepts will now be described more fully with reference to the accompanying drawings, in which some example embodiments are shown. Example embodiments of the inventive concepts may, however, be embodied in many different forms and should not be construed as being limited to the example embodiments set forth herein; rather, these example embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
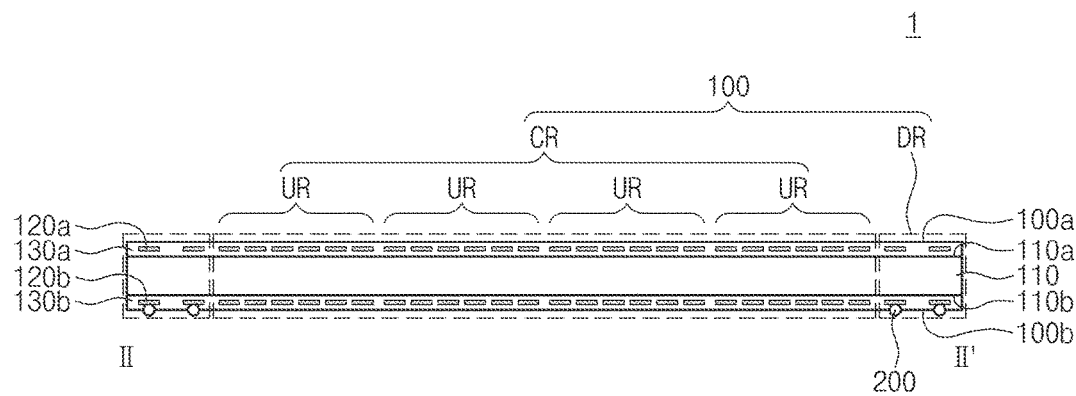
FIG. 2 is a sectional view taken along line II-II' of FIG. 1.
Figure 3:
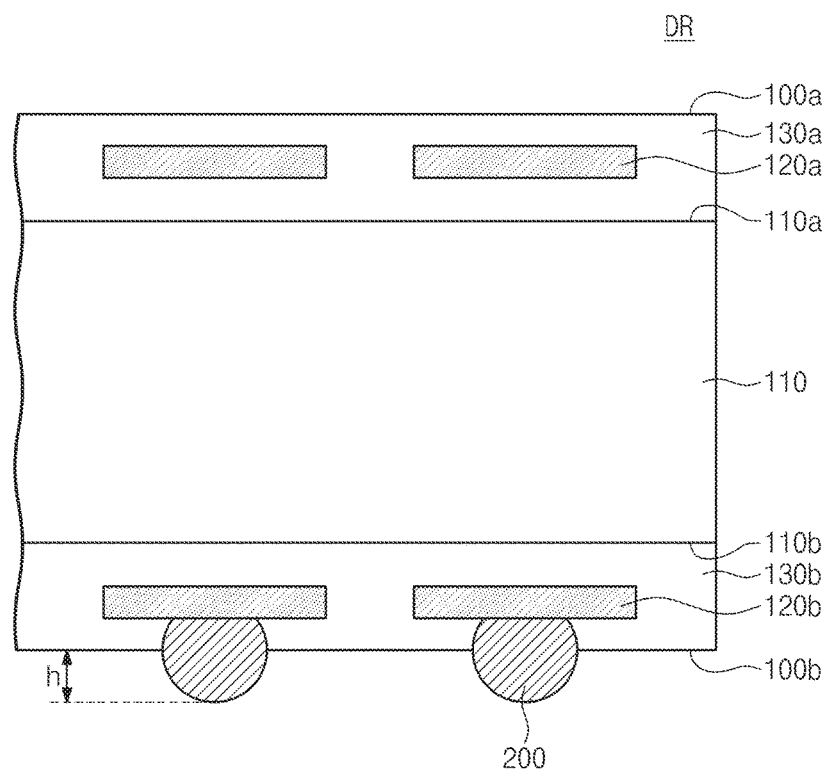
FIG. 3 is an enlarged sectional view illustrating a dummy region of FIG. 2.

FIG. 1 is a plan view illustrating a package substrate according to some example embodiments of the inventive concepts, FIG. 2 is a sectional view taken along line II-II' of FIG. 1, and FIG. 3 is an enlarged sectional view illustrating a dummy region of FIG. 2.

Referring to FIGS. 1 through 3, a package substrate 1 may include a substrate 100 and solders 200 provided on the substrate 100. The substrate 100 may include a circuit region CR, in which unit regions UR are arranged in a matrix shape, and a dummy region DR fully or partially surrounding the circuit region CR. The solders 200 may be provided on the dummy region DR. The package substrate 1 may be a substrate provided in strip type.

The substrate 100 may have a top surface 100a and a bottom surface 100b facing each other and may be configured to include circuit patterns, which are provided on each or at least one of the top and bottom surfaces 100a and 100b. As an example, the substrate 100 may be a printed circuit board (PCB). The circuit region CR may provide an area, on which a semiconductor chip will be mounted. The dummy region DR may be provided along or near an edge of the substrate 100, for example, to partially or fully surround the circuit region CR.

The substrate 100 may include a core portion 110, in which insulating layers (not shown) and interconnection layers (not shown) are alternatingly stacked, circuit patterns 120a and 120b, which are provided on at least one of top and bottom surfaces 110a and 110b of the core portion 110, and solder resists 130a and 130b, which are respectively provided on the circuit patterns 120a and 120b. For example, the insulating layer may be formed of or include a resin material, and the interconnection layer may be formed of or include a metallic material (e.g., nickel or copper).

The circuit patterns 120a and 120b may include an upper circuit pattern 120a, which is provided on the top surface 110a of the core portion 110, and a lower circuit pattern 120b, which is provided on the bottom surface 110b of the core portion 110. The upper circuit pattern 120a and the lower circuit pattern 120b may be formed of or include at least one of metallic materials (e.g., nickel (Ni) or copper (Cu)).

The solder resists 130a and 130b may include an upper solder resist 130a, which is provided on the upper circuit pattern 120a, and a lower solder resist 130b, which is provided on the lower circuit pattern 120b. The upper and lower solder resists 130a and 130b may protect the circuit patterns 120a and 120b against external environment and may prevent a bridge from being formed between the circuit patterns 120a and 120b. The upper solder resist 130a may expose a portion of the upper circuit pattern 120a, and the lower solder resist 130b may expose a portion of the lower circuit pattern 120b.

The solders 200 may be provided around (e.g., fully or partially surrounding) the circuit region CR. For example, the solders 200 may be arranged spaced apart from each other and along an edge of the dummy region DR, thereby forming a ring-shaped arrangement. The solders 200 may be arranged to form a plurality of columns. In some example embodiments, the solders 200 may be arranged substantially symmetric about a center of the circuit region CR. The symmetric arrangement of the solders 200 on the dummy region DR may reduce a spatial variation in pressure, which may be exerted to the package substrate 1 in a subsequent mold process. For example, in the case where the solders 200 are not arranged to have such symmetry on the dummy region DR, it may be difficult to realize high uniformity in thickness of a mold layer (not shown) to be formed on the package substrate 1.

The solders 200 may be on the bottom surface 100b of the package substrate 100 at the dummy region DR. The solders 200 may be electrically connected to the lower circuit pattern 120b. The solders 200 may be formed of or include an alloy including at least one of tin (Sn), silver (Ag), copper (Cu), nickel (Ni), bismuth (Bi), indium (In), antimony (Sb), and cerium (Ce).

The solders 200 may protrude from the bottom surface 100b of the package substrate 100 by a height h of about 1 µm to about 5 µm. The protrusion height h of the solders 200 may be smaller than a thickness of the substrate 100. For example, the protrusion height h of the solders 200 may be smaller than about 1/80 times the thickness of the substrate 100. In the case where the height h of the solders 200 is increased, a possibility that contamination occurs in the subsequent semiconductor fabrication processes may increase, and moreover, mitigating or preventing higher stress from being exerted to the package substrate 1 and/or mitigating or preventing warpage from occurring in the package substrate 1 may become more and more challenging. In the case where the height h of the solders 200 is decreased, electrically grounding the package substrate 1 and thus consequently discharging remaining electric charges from the package substrate 1 may be difficult. Accordingly, the height h of the solders 200 needs to be selected in consideration of the above technical issues.

Figure 4:
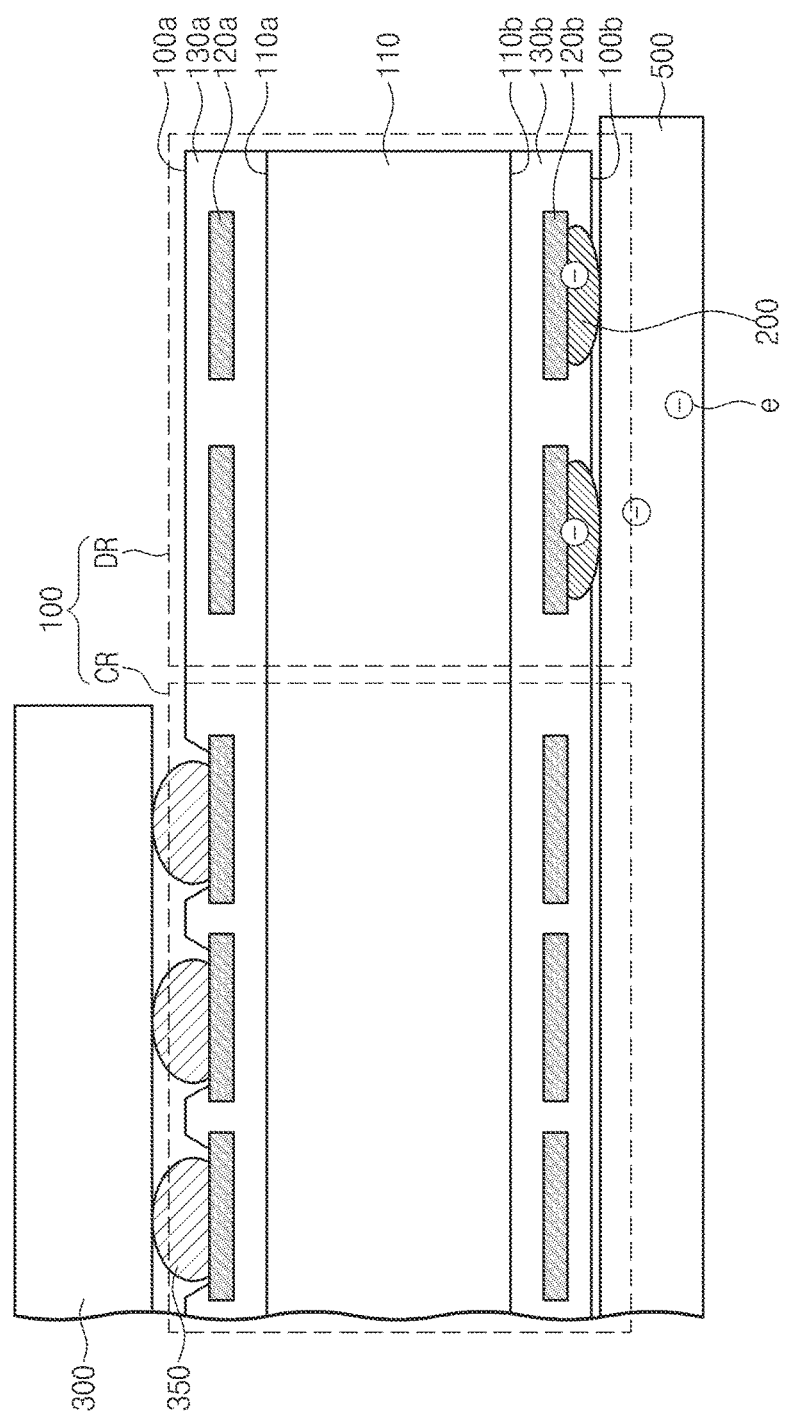
FIG. 4 is a diagram showing how to prevent electrostatic discharge failure from occurring in a package substrate according to some example embodiments of the inventive concepts.

FIG. 4 is a diagram showing how to prevent electrostatic discharge failure from occurring in a package substrate according to some example embodiments of the inventive concepts.

Referring to FIG. 4, a semiconductor chip 300 may be mounted on the package substrate 1 in strip type. In some example embodiments, the semiconductor chip 300 may be a logic chip or a memory chip. The semiconductor chip 300 may be electrically connected to the package substrate 1 through a connecting element 350. The connecting element 350 may be formed of or include an alloy including at least one of tin (Sn), silver (Ag), copper (Cu), nickel (Ni), bismuth (Bi), indium (In), antimony (Sb), and cerium (Ce).

A mold process may be performed to form a mold layer (not shown) for protecting the semiconductor chip 300 mounted on the package substrate 1. The mold process may include coating a paste on the package substrate 1 and providing a mold structure 500 on the bottom surface 100b of the package substrate 1. The paste may include, for example, an epoxy molding compound (EMC) material. A thermocompression bonding process may be performed to allow the solders 200 provided on the package substrate 1 to be in direct contact with the mold structure 500. Because the solders 200 are flexible in a high temperature process of about 150° C. or higher, the solders 200 may be inhibited or prevented from being broken in the thermocompression bonding process. Because the solders 200 and the mold structure 500 are electrically connected to each other, electric charges e can be discharged from the package substrate 1 and the semiconductor chip 300 to the outside through the mold structure 500. For example, the package substrate 1 and the semiconductor chip 300 may be grounded through a ground terminal provided in the mold structure 500.

During a process of fabricating a semiconductor package, electric charges e may flow into the package substrate 1 and the semiconductor chip 300. Such electric charges e may cause the package substrate 1 and the semiconductor package to suffer from electrostatic failures. For example, in the case where a large amount of charges e are concentrated to one of input/output pins, an operation failure (e.g., a short or open circuit) may occur.

According to some example embodiments of the inventive concepts, the solders 200 in contact with the mold structure 500 may be provided on the dummy region DR of the package substrate 1, and thus the electrostatic failure in the mold process may be inhibited or prevented from occurring.

Figure 5:
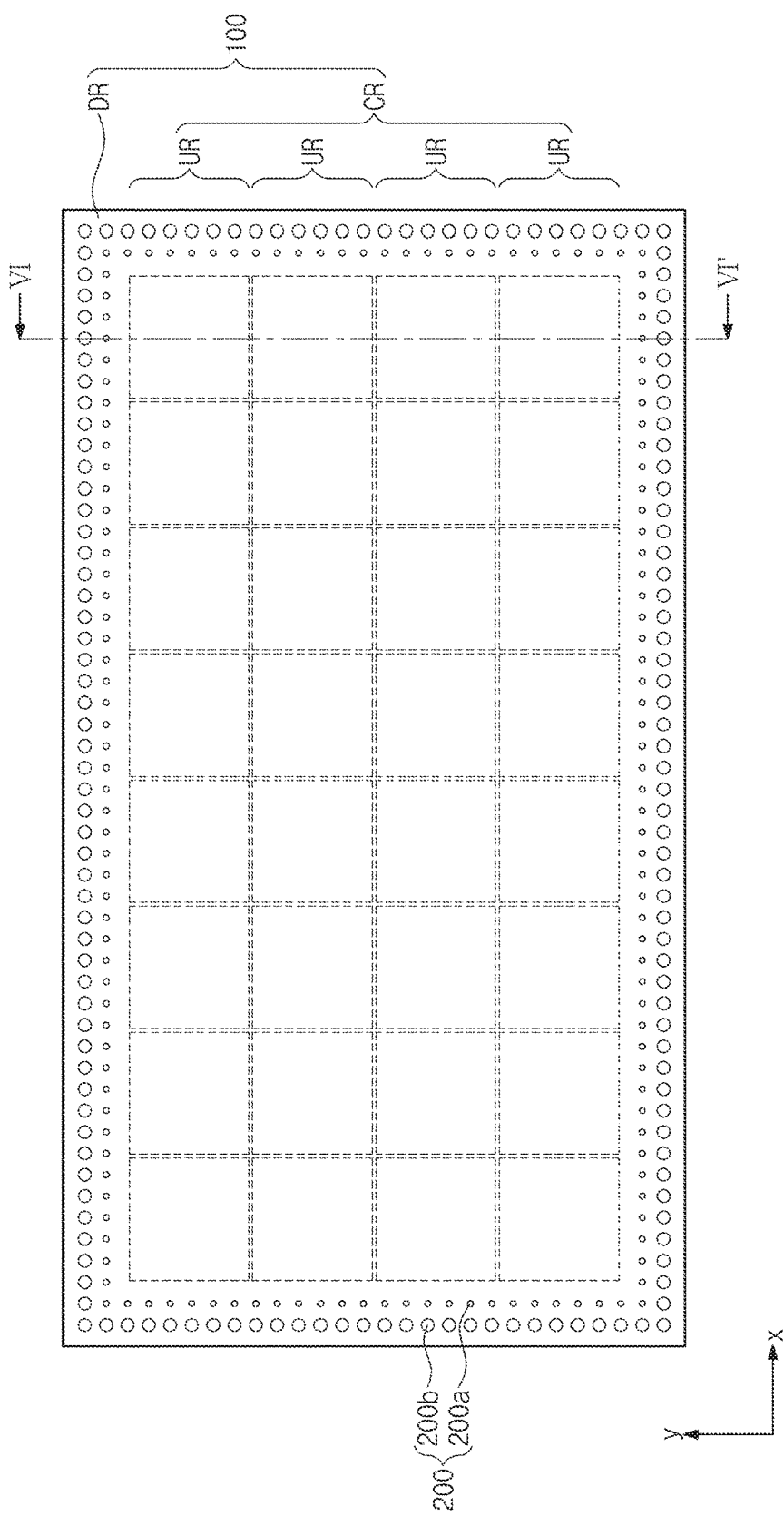
FIG. 5 is a plan view illustrating a package substrate, according to some example embodiments of the inventive concepts.
Figure 6:
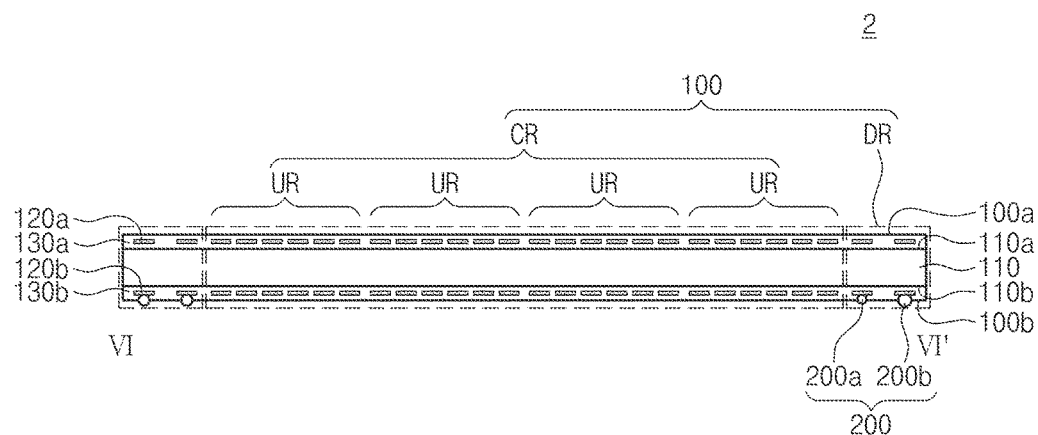
FIG. 6 is a sectional view taken along line VI-VI' of FIG. 5.
Figure 7:
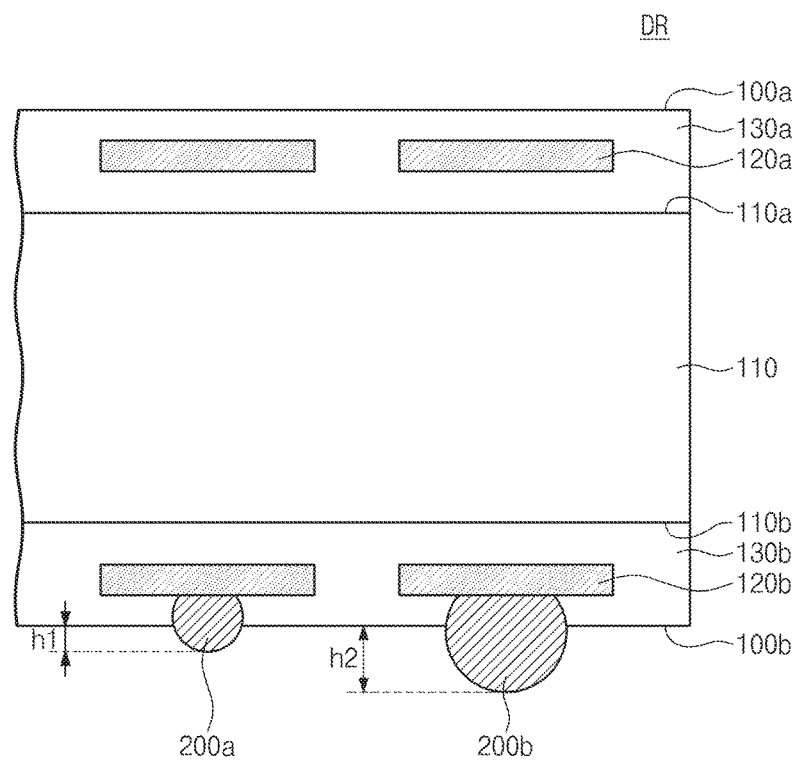
FIG. 7 is an enlarged sectional view illustrating a dummy region of FIG. 6.

FIG. 5 is a plan view illustrating a package substrate, according to some example embodiments of the inventive concepts, FIG. 6 is a sectional view taken along line VI-VI' of FIG. 5, and FIG. 7 is an enlarged sectional view illustrating a dummy region of FIG. 6. For concise description, a previously described element may be identified by a similar or identical reference number without repeating an overlapping description thereof.

Referring to FIGS. 5 through 7, a package substrate 2 may include a substrate 100 and solders 200 provided on the substrate 100. The substrate 100 may include a circuit region CR, in which unit regions UR are arranged in a matrix shape, and a dummy region DR fully or partially enclosing the circuit region CR. The solders 200 may be provided on the dummy region DR.

The solders 200 may be provided on the dummy region DR of the package substrate 2. The solders 200 may include first solders 200a, which are adjacent to the circuit region CR, and second solders 200b, which are adjacent to an edge of the substrate 100. The first solders 200a may be arranged spaced apart from each other and along an edge of the dummy region DR, thereby forming a ring-shaped arrangement. The first solders 200a may be provided around (e.g., to fully or partially surround) the circuit region CR. The second solders 200b may be spaced apart from each other to partially or fully surround the first solders 200a, thereby forming a ring-shaped arrangement. The first solders 200a and the second solders 200b may be arranged to be substantially symmetric about a center of the circuit region CR.

The first solders 200a and the second solders 200b may be provided to have different sizes. When measured in a direction normal to the bottom surface 100b, the first solders 200a may have a first height h1 and the second solders 200b may have a second height h2. The first height h1 and the second height h2 may be different from each other. For example, the second height h2 may be greater than the first height h1. In some example embodiments, the first height h1 and the second height h2 may be different from each other within a range from about 1 µm to about 5 µm.

The difference in size or height of the solders 200 may allow establishing an interconnection structure for discharging electrons, even when the lower solder resist 130b is formed to have a large thickness. For example, even when the first solders 200a with a smaller size are fully covered with the lower solder resist 130b, the package substrate 2 may be grounded through the second solders 200b with a larger size.

FIGS. 8 through 11 are plan views illustrating a package substrate according to some example embodiments of the inventive concepts.

Figure 8:
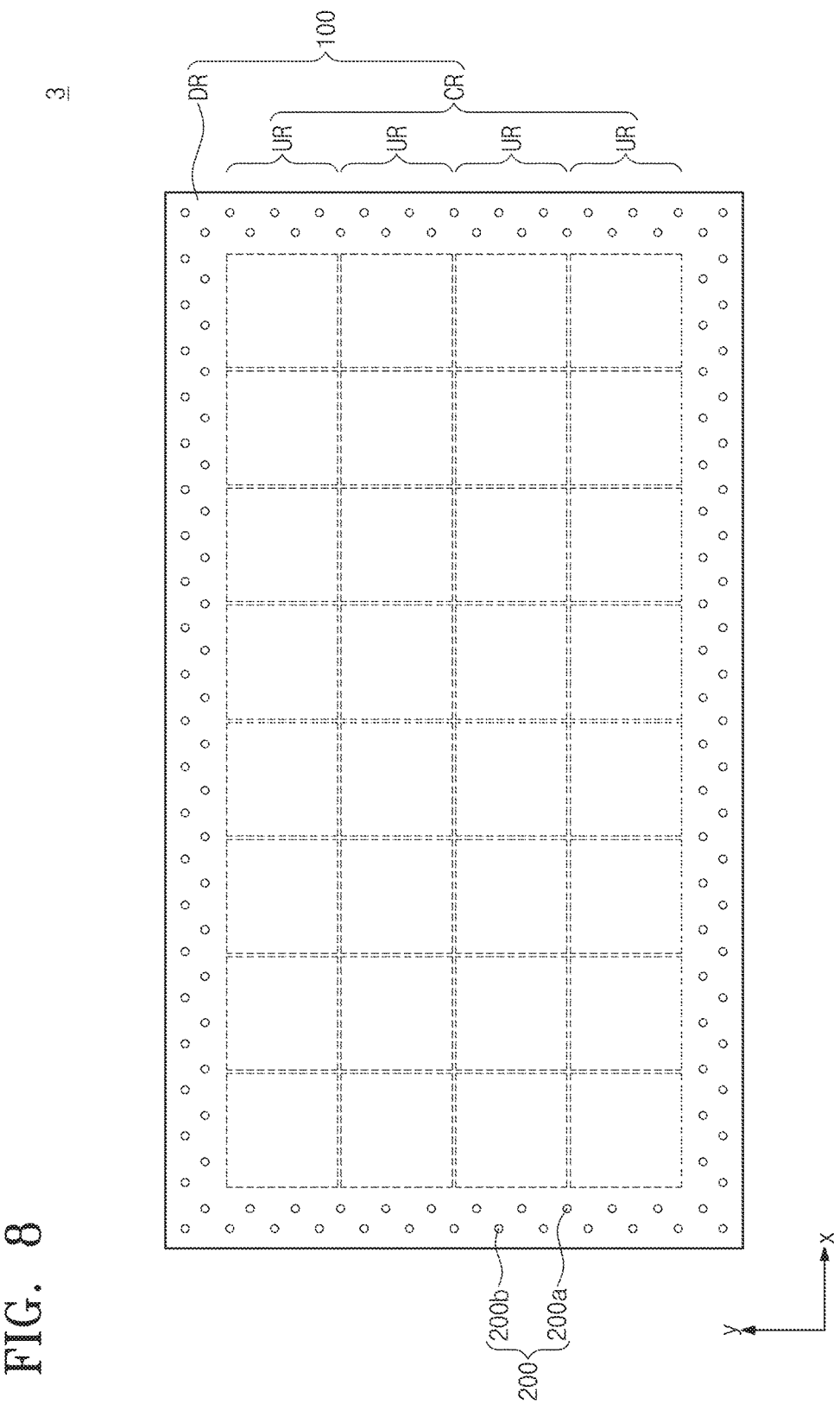
FIGS. 8 through 11 are plan views illustrating a package substrate according to some example embodiments of the inventive concepts.

Referring to FIG. 8, solders 200 may include first solders 200a, which are arranged along the edge of the substrate 100, and second solders 200b, which are arranged along the edge of the substrate 100 and around and outside the first solders 200a. When viewed in a plan view, the first solders 200a and the second solders 200b may be disposed to have a zigzag arrangement. The first solders 200a and the second solders 200b may be disposed to be substantially symmetric about a center of the circuit region CR.

Figure 9:
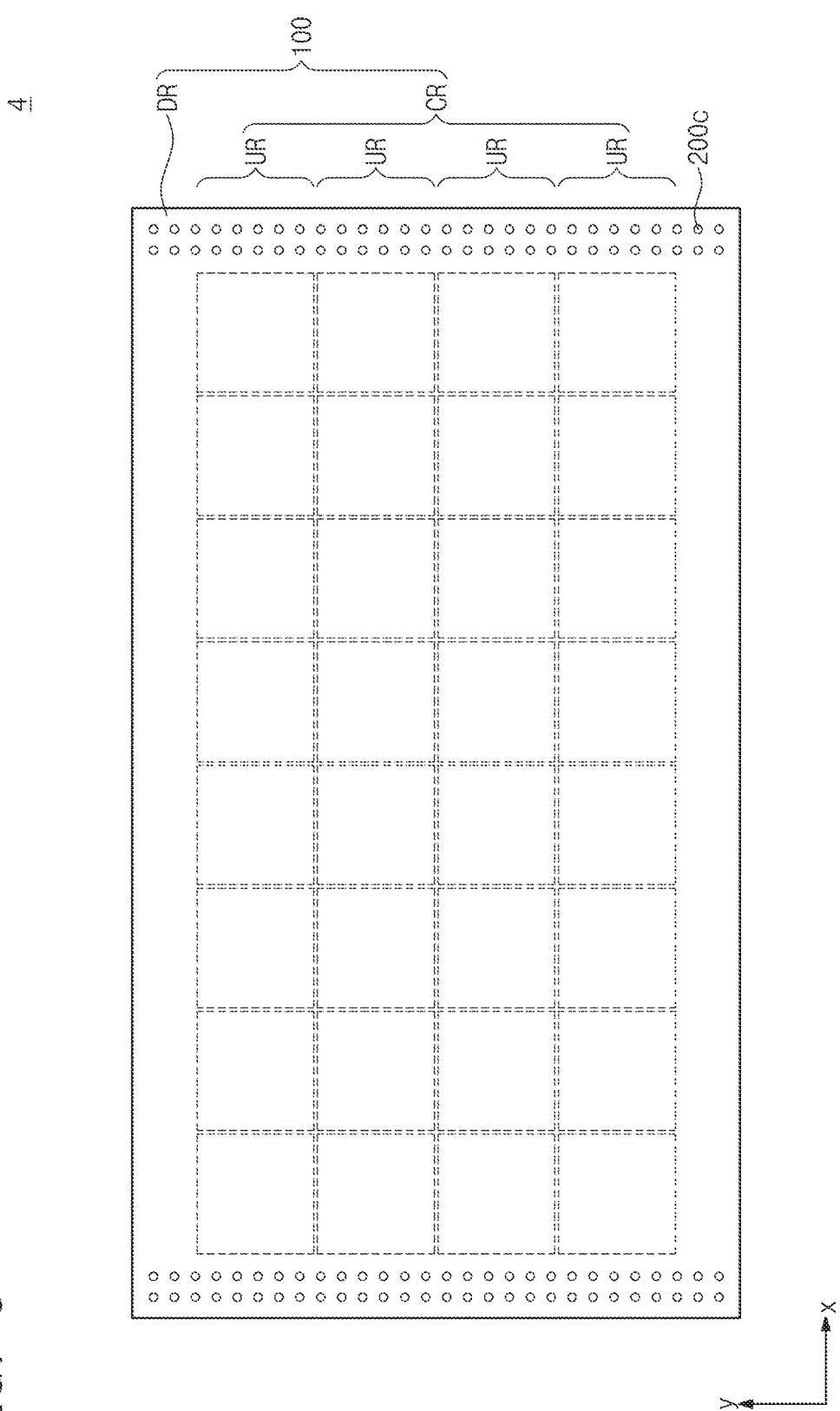

Referring to FIG. 9, solders 200c may be disposed to face each other in a first direction x. For example, the solders 200c may be arranged, along a second direction y perpendicular to the first direction x, on two opposite side regions relative to the circuit region CR. The solders 200c may be disposed along the edge of the substrate 100 to form a plurality of columns that are spaced apart from each other in the first direction x. The solders 200c may be spaced apart from each other in the second direction y, thereby forming a dotted line arrangement. In the second direction y, the solders 200c may not be provided on two opposite side regions of the substrate 100 relative to the circuit region CR.

In certain example embodiments, the sizes of the solders 200c may be different from column to column. The solders 200c provided in each column may have substantially the same size, and the solders 200c provided in different columns may have different sizes from each other.

Figure 10:
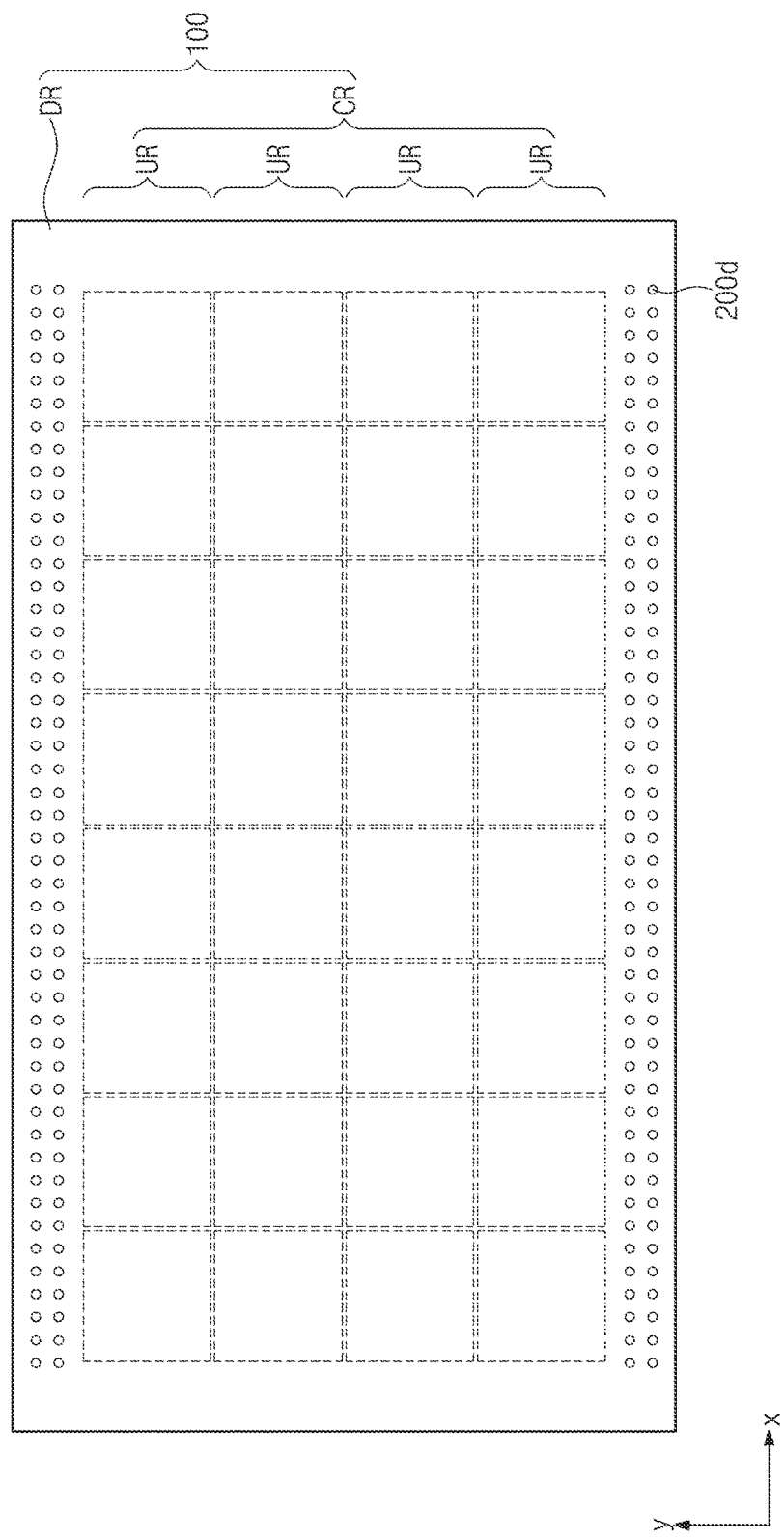

Referring to FIG. 10, solders 200d may be disposed to face each other in a second direction y. For example, the solders 200d may be arranged along a first direction x perpendicular to the second direction y, on two opposite side regions relative to the circuit region CR. The solders 200d may be disposed along the edge of the substrate 100 to form a plurality of columns that are spaced apart from each other in the second direction y. The solders 200d may be spaced apart from each other in the first direction x, thereby forming a dotted line arrangement. In the first direction x, the solders 200d may not be provided on two opposite side regions of the substrate 100 relative to the circuit region CR.

In certain example embodiments, the sizes of the solders 200d may be different from column to column. The solders 200d provided in each column may have substantially the same size, and the solders 200d provided in different columns may have different sizes from each other.

Figure 11:
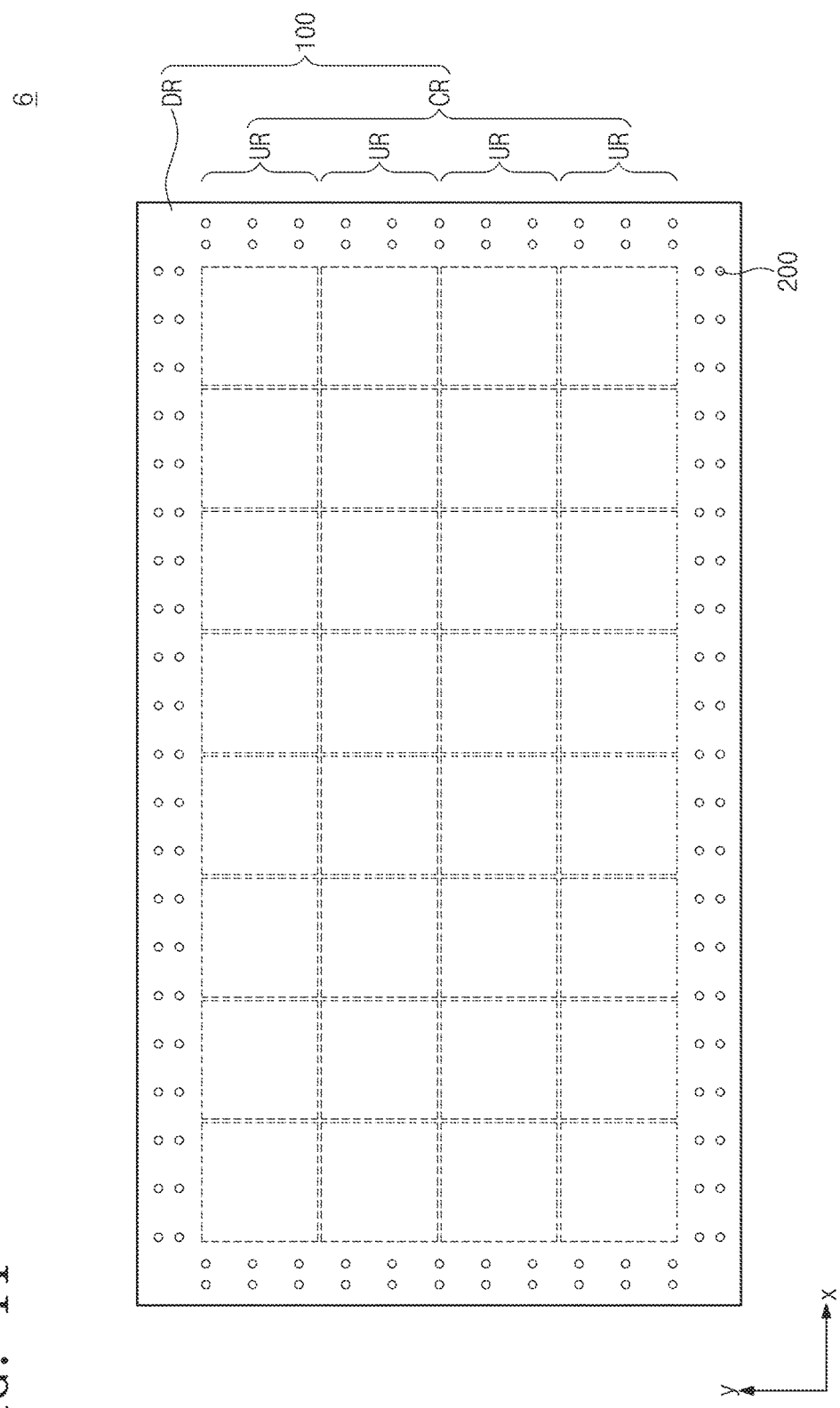

Referring to FIG. 11, the number or density of the solders 200 may be smaller than those of the previous example embodiments. For example, a distance between the solders 200 may be larger than those of the previous example embodiments. The solders 200 may be provided to be symmetrically arranged about a center of the circuit region CR. According to some example embodiments, the solders 200 may not be provided on corner regions of the dummy region DR.

In addition to the afore-described examples, the solders 200 may be arranged on the dummy region DR in various manners. For example, the solders 200 may be arranged in a single column or in two or more columns. Furthermore, the solders 200 may be disposed to be symmetric about the circuit region CR.

According to some example embodiments of the inventive concepts, a package substrate may be configured to allow remaining charges to be discharged to the outside of the package substrate.

According to some example embodiments of the inventive concepts, a mold process may be performed while discharging remaining charges from the package substrate to the outside. The electric charges may be inhibited or prevented from remaining in a semiconductor package including a package substrate and a semiconductor chip mounted thereon, and thus an electrostatic discharge failure may be inhibited or prevented from occurring in a semiconductor package.

While some example embodiments of the inventive concepts have been particularly shown and described, it will be understood by one of ordinary skill in the art that variations in form and detail may be made therein without departing from the spirit and scope of the attached claims.

What is claimed is:

1. A package substrate, comprising:
    a substrate including a circuit region, an electrostatic discharge region surrounding the circuit region, and a lower circuit pattern in the electrostatic discharge region on a bottom surface of the substrate;
    a semiconductor chip mounted on a top surface of the substrate;
    a mold structure on the bottom surface of the substrate, the mold structure being grounded; and
    solders on the lower circuit pattern, the solders at least partially surrounding the circuit region, at least some of the solders configured to be grounded when connected to a ground terminal of the mold structure in a mold process.

2. The package substrate of claim 1, wherein the solders are at two opposite sides, from among four sides, of the substrate.

3. The package substrate of claim 1, at least some of the solders protrude from the bottom surface of the substrate by a height of about 1 µm to about 5 µm.

4. The package substrate of claim 1, wherein the solders comprise:
    a set of first solders in the electrostatic discharge region; and
    a set of second solders around and outside the set of first solders with respect to the circuit region,
    wherein the set of first solders are different from the set of second solders, in terms of their heights with respect to the bottom surface of the substrate.

5. The package substrate of claim 4, wherein a height of the set of first solders is greater than a height of the set of second solders.

6. The package substrate of claim 1, wherein a height of the solders is smaller than 1/80 times a thickness of the substrate.

7. The package substrate of claim 1, wherein
    the solders are disposed to form a plurality of columns, and
    sizes of the solders are different from the column to the column.

8. A package substrate, comprising:
    a substrate including a circuit region, and a electrostatic discharge region surrounding the circuit region, the circuit region including unit regions arranged in a matrix shape, each of the electrostatic discharge region and circuit region including a lower circuit pattern and an upper circuit pattern;
    a semiconductor chip mounted on a top surface of the substrate;
    a mold structure on a bottom surface of the substrate, the mold structure being grounded; and
    solders on the lower circuit pattern of the electrostatic discharge region, at least one of the solders electrically connected to the mold structure,
    wherein the solders are spaced apart from the lower circuit pattern of the circuit region.

9. The package substrate of claim 8, wherein the solders do not vertically overlap the circuit region.

10. The package substrate of claim 8, wherein the substrate further comprises:
    a core portion including interconnection layers and insulating layers alternatingly stacked with each other.

11. The package substrate of claim 10, further comprising:
    a solder resist selectively covering a top and bottom surfaces of the core portion to expose at least a portion of the lower circuit pattern.

12. The package substrate of claim 8, wherein the solders are along an edge of the substrate to form a ring-shaped arrangement.

13. The package substrate of claim 8, wherein the solders include an alloy including at least one of tin (Sn), silver (Ag), copper (Cu), nickel (Ni), bismuth (Bi), indium (In), antimony (Sb), or and cerium (Ce).

14. The package substrate of claim 8, wherein the upper circuit pattern and the lower circuit pattern include nickel (Ni) or copper (Cu).

15. A package substrate, comprising:
    a substrate including a circuit region, a electrostatic discharge region surrounding the circuit region, and a lower circuit pattern in the electrostatic discharge region on a bottom surface of the substrate;
    a semiconductor chip mounted on a top surface of the substrate;
    a mold structure on the bottom surface of the substrate, the mold structure being grounded; and
    solders on the lower circuit pattern, the solders at least partially surrounding the circuit region, at least one of the solders electrically connected to the mold structure.

16. The package substrate of claim 15, wherein
    the semiconductor chip electrically connected to the substrate through a connecting element, and
    the connecting element includes an alloy including at least one of tin (Sn), silver (Ag), copper (Cu), nickel (Ni), bismuth (Bi), indium (In), antimony (Sb), or and cerium (Ce).

17. The package substrate of claim 15, wherein the solders comprise:
    a set of first solders along an edge of the substrate; and
    a set of second solders around and outside the set of first solders, the set of first solders being different from the set of second solders in terms of their sizes.

18. The package substrate of claim 17, wherein the set of first solders is on two opposite regions relative to the circuit region in a first direction.

19. The package substrate of claim 15, wherein the solders are arranged symmetric about the circuit region.

20. The package substrate of claim 15, wherein the substrate further comprises:
    a core portion including interconnection layers and insulating layers alternatingly stacked with each other; and
    a solder resist selectively covering a top and bottom surfaces of the core portion to expose at least a portion of the lower circuit pattern.

* * * * *